(12) United States Patent
Rule et al.

(10) Patent No.: US 8,055,464 B2
(45) Date of Patent: Nov. 8, 2011

(54) METHOD OF PROCESSING WAVEFORM DATA FROM ONE OR MORE CHANNELS USING A TEST AND MEASUREMENT INSTRUMENT

(75) Inventors: Keith D. Rule, Beaverton, OR (US);
Mehrab Sedeh, Beaverton, OR (US);
Robert D. Twete, Beaverton, OR (US);
Tristan A. Robinson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 412 days.

(21) Appl. No.: 12/206,072

(22) Filed: Sep. 8, 2008

(65) Prior Publication Data
US 2010/0063760 A1  Mar. 11, 2010

(51) Int. Cl.
*G01R 13/22* (2006.01)
(52) U.S. Cl. .......................................................... 702/68
(58) Field of Classification Search .................. 702/67, 702/68; 715/771, 773
See application file for complete search history.

(56) References Cited

U.S. PATENT DOCUMENTS

| | | | |
|---|---|---|---|
| 6,707,474 B1 * | 3/2004 | Beck et al. | 715/771 |
| 7,315,791 B2 * | 1/2008 | Ilic et al. | 702/125 |
| 2002/0147554 A1 * | 10/2002 | Pickerd | 702/66 |

* cited by examiner

Primary Examiner — Bryan Bui
(74) Attorney, Agent, or Firm — Langlotz Patent Works, Inc.; Thomas F. Lenihan; Francis I. Gray

(57) ABSTRACT

The method of processing waveform data from one or more channels using a test and measurement instrument, such as an oscilloscope, is described in which waveform data is collected from a DUT; defining a context is defined by instructing the instrument to obtain the focus of each waveform datum having a first user-defined attribute; defining a selection criteria by instructing the instrument to obtain the focus of each waveform datum having both a first user-defined attribute and a second user-defined attribute; and defining an action by instructing the instrument to perform an operation responsive to finding at least one waveform datum having both the first user-defined attribute and the second user-defined attribute.

16 Claims, 13 Drawing Sheets

Vert 100mV/Div, Horiz 200ps/Div
Waveform Database of Query without Special Settings Vert 100mV/Div, Horiz 200ps/Div
Query with Edge Settings

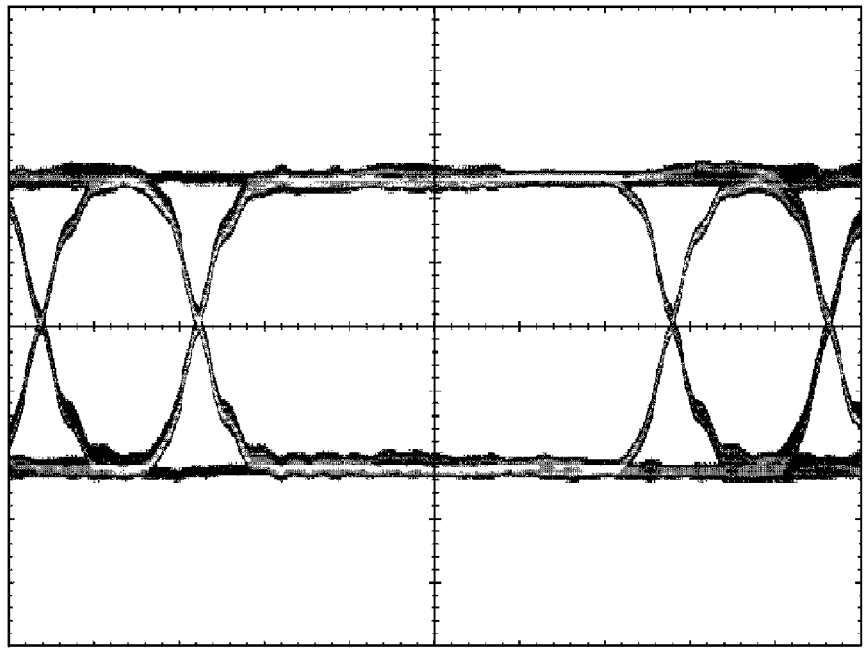

Vert 100mV/Div, Horiz 200ps/Div
Waveform Database of Query with Linear Clock Recovery

FIG.8

| | | |
|---|---|---|
| Serial Decoder | Decoder Queries<br>8b10b words/bytes/symbols,<br>PCIe words/bytes/symbols,<br>SATA words/bytes/symbols | |
| Bit Stream | Bit Stream Queries<br>Bit, Jitter, Ideal, Edge,<br>Clock Edge, Bit Edge | Bit Attributes<br>SymbolRate, UI, ClockRecovery,<br>PLLOrder, PLLDampingFactor |
| Edge Finder | Edge Queries<br>Period, Rise, Fall, Edge,<br>PDuty, NDuty | Edge Attributes<br>MPCT, HPCT, LPCT, HYSPCT,<br>MREF, HREF, LREF, HYSREF |
| Digitized Data | Math Operations<br>+, -, *, /, Invert, LogE, Min,<br>Max, High, Low, Peak2Peak | |

Types of Calculation with Noted Settings [Attributes]

FIG.9

Vert 100mV/Div, Horiz 200ps/Div
Waveform Database from a Query

Vert 100mV/Div, Horiz 200ps/Div
The Waveform Database Anchored at -UI*2

Vert 100mV/Div, Horiz 200ps/Div
Rectangular Region Selected by the User

Detail of Mask Violation

METHOD OF PROCESSING WAVEFORM DATA FROM ONE OR MORE CHANNELS USING A TEST AND MEASUREMENT INSTRUMENT

FIELD OF THE INVENTION

The present invention relates to a method of processing waveform data from one or more channels using a test and measurement instrument for use in connection with analyzing waveforms. The method of processing waveform data from one or more channels using a test and measurement instrument has particular utility in connection with providing a query language to facilitate analysis and display of large quantities of waveform data as well as complex waveforms.

BACKGROUND OF THE INVENTION

Methods of processing waveform data from one or more channels using a test and measurement instrument are desirable for providing a query language to facilitate analysis and display of large quantities of waveform data as well as complex waveforms. Currently, in order to perform analysis on a test and measurement instrument, users have to work with an entire record. Records consist of a series of measurements made over time, typically of voltage. Record lengths are increasing because many serial digital signals are in use, such as those utilized by the Serial Advanced Technology Attachment (SATA) computer bus. The SATA computer bus is designed for transferring data between a computer and mass storage devices.

To prevent noise from causing significant interference with the data signal at the high transmission speeds of SATA systems, differential signaling is used to make it easy to filter out the noise from the data signal at the receiving end. However, the waveforms of such systems are difficult to analyze because jitter in the signal is present to reduce the noise interference. In order to remove the jitter from the signal, a large amount of data must be collected so that linear regression can be performed to obtain start and stop points, and then a low pass filter can be used to eliminate the jitter. Although these operations eliminate the jitter, the long record makes it very difficult for users to sort through the captured data to find areas of interest. With longer waveforms, it is more difficult for users to see cause-and-effect in serial data.

Although analyzing serial digital signals is increasingly important, current test and measurement instruments do not make it easy for users to analyze such signals. Currently available test and measurement instruments provide either a very limited math subsystem that can work only on an entire record or require users to write code in a programming language running on an existing math engine to perform complex analyses. Neither of these approaches makes it easy to find abnormalities because users cannot evaluate only a portion of the waveform. Furthermore, math is not a very expressive way to interact with long waveforms, and general-purpose programming languages introduce a large barrier for many users of test and measurement instruments.

Existing high-end oscilloscopes, such as those currently manufactured by Tektronix, Inc., already incorporate a search/mark capability to mark foci automatically on a waveform matching a user-defined event. A user can subsequently navigate through these marks to inspect the waveform in identified foci. However, the types of events users can specify are very limited.

The use of query languages is known in the prior art. For example, Structured Query Language (SQL) is the predominant approach used to interact with databases. SQL is a standard interactive and programming language for querying and modifying data and managing databases. SQL is designed for a specific purpose: to query data contained in a relational database. Although SQL is not as powerful as directly manipulating the database with a native programming Application Programming Interface (API), it is nonetheless very useful and easy to learn. Data analysis in a test and measurement instrument could be greatly simplified and generalized by using a query language. However, the underlying data type in most oscilloscopes is some form of digitized waveform. This data type does not lend itself to being manipulated using the same access model as SQL. Therefore, a novel method of modeling waveforms so that an expressive query language can be defined for generalized analysis is required.

Therefore, a need exists for a new and improved method of processing waveform data from one or more channels using a test and measurement instrument that can be used for providing a query language to facilitate analysis and display of large quantities of waveform data as well as complex waveforms. In this regard, the various embodiments of the present invention substantially fulfill at least some of these needs. In this respect, the method of processing waveform data from one or more channels using a test and measurement instrument according to the present invention substantially departs from the conventional concepts and designs of the prior art, and in doing so provides an apparatus primarily developed for the purpose of providing a query language to facilitate analysis and display of large quantities of waveform data as well as complex waveforms.

SUMMARY OF THE INVENTION

The present invention provides an improved method of processing waveform data from one or more channels using a test and measurement instrument, and overcomes the above-mentioned disadvantages and drawbacks of the prior art. As such, the general purpose of the present invention, which will be described subsequently in greater detail, is to provide an improved method of processing waveform data from one or more channels using a test and measurement instrument that has all the advantages of the prior art mentioned above.

To attain this, the preferred embodiment of the present invention essentially comprises the steps of: providing a test and measurement instrument; attaching the test and measurement instrument to a Device Under Test (DUT) to be measured; collecting waveform data comprising at least one waveform datum from the DUT, each waveform datum having an amplitude and a position in horizontal units defining its focus; defining a context by instructing the test and measurement instrument to obtain the focus of each waveform datum having a first user-defined attribute, wherein the attribute is a characteristic of the waveform datum's focus and/or amplitude; defining a selection criteria by instructing the test and measurement instrument to obtain the focus of each waveform datum having both a first user-defined attribute and a second user-defined attribute, wherein the attributes are a characteristic of the waveform datum's focus and/or amplitude; and defining an action by instructing the test and measurement instrument to perform an operation responsive to finding at least one waveform datum having both the first user-defined attribute and the second user-defined attribute. The test and measurement instrument may be an oscilloscope. Contexts, selection criteria, and actions may be defined by providing the test and measurement instrument with a command written in any waveform query language. There are, of course, additional features of the invention that will be described hereinafter and which will form the subject matter of the claims attached.

There has thus been outlined, rather broadly, the more important features of the invention in order that the detailed description thereof that follows may be better understood and in order that the present contribution to the art may be better appreciated.

BRIEF DESCRIPTION OF THE DRAWINGS

FIG. 8 is a diagram view depicting results of a query with linear clock recovery constructed in accordance with the principles of the present invention.

FIG. 9 is a diagram view depicting types of calculations with noted settings [attributes] in accordance with the principles of the present invention.

The same reference numerals refer to the same parts throughout the various figures.

DESCRIPTION OF THE CURRENT EMBODIMENT

Figure 1:
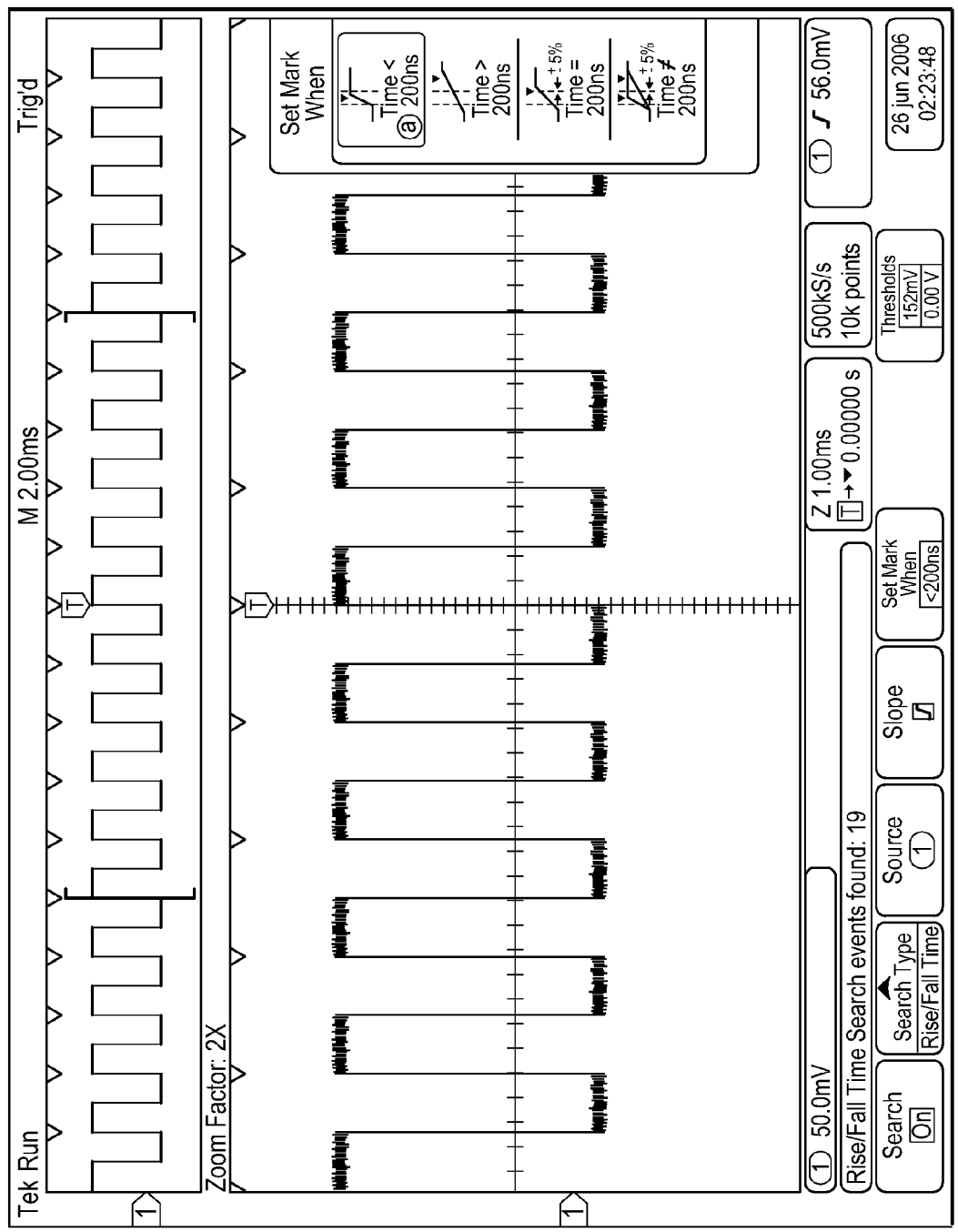
FIG. 1 is a diagram depicting the results of a Mark query constructed in accordance with the principles of the present invention.

A preferred embodiment of the method of processing waveform data from one or more channels using a test and measurement instrument is shown and generally designated by the reference numeral 1000.

The principles of the present invention are applicable to a variety of computer hardware and software configurations. The term "computer hardware" or "hardware," as used herein, refers to any machine or apparatus that is capable of accepting, performing logic operations on, storing, or displaying data, and includes without limitation processors and memory; the term "computer software" or "software," refers to any set of instructions operable to cause computer hardware to perform an operation. A "computer," as that term is used herein, includes without limitation any useful combination of hardware and software, and a "computer program" or "program" includes without limitation any software operable to cause computer hardware to accept, perform logic operations on, store, or display data. A computer program may, and often is, comprised of a plurality of smaller programming units, including without limitation subroutines, modules, functions, methods, and procedures. Thus, the functions of the present invention may be distributed among a plurality of computers and computer programs. The invention is described best, though, as a single computer program that configures and enables one or more general-purpose computers to implement the novel aspects of the invention.

The present invention provides a method of decomposing a larger waveform into smaller pieces and then qualifying which pieces are used in further analysis. A "context" is used to allow the user to specify a set of regions in a larger waveform that are of interest. A context is simply a set of rules that allow the waveforms be divided into sets. The context must have some meaning to the user. For example, Period could be the high-level name for a context that defined a region between a rising edge and the next rising edge of a waveform.

Once a set of regions is identified that meets the context's criteria, those areas can be subjected to further analysis. Examples of further analysis that could be directed by the query language could include:

Using the results in additional queries.

Displaying the results to the instrument's graticule as a Fast Frame waveform, a waveform database, or as a Real-Time Eye diagram.

Saving the results in a file for analysis in another program.

Storing the results in a mass waveform or a measurement result.

Computing results using math or measurement functions on the query results.

Marking the results so they can be annotated on the screen in a way that a user can navigate to.

Stopping the instrument so that further user inspection can occur.

The query language relies upon a syntax consisting of an Action, a Context, and a Selection Criteria. For example, to mark all of the rising edges less than 200 ns on a waveform collected by Channel 1, the user would create the query, mark CH1.Edge when CH1.Rise<200 ns. The results of such a query, depicted as triangle annotations on the waveform, are illustrated in FIG. 1.

The Context and the Selection Criteria together define a selection list that the Action is performed on. Using this style of syntax, queries that are more complex can be expressed. For example, the following query selects only Periods where both of the specified criteria are met: mark CH1.Period When CH1.Rise<200 ns And CH2.Fall>210 ns.

This technique can also be used with protocol decoding the specified context. For example, the selection list in the following returns only the TCP/IP packets where Channel 1 to Channel 2 crosstalk is greater than 2.5 dB: mark CH1.TCPIP.Packet when (CH1, CH2).Crosstalk>2.5 dB.

Figure 2:
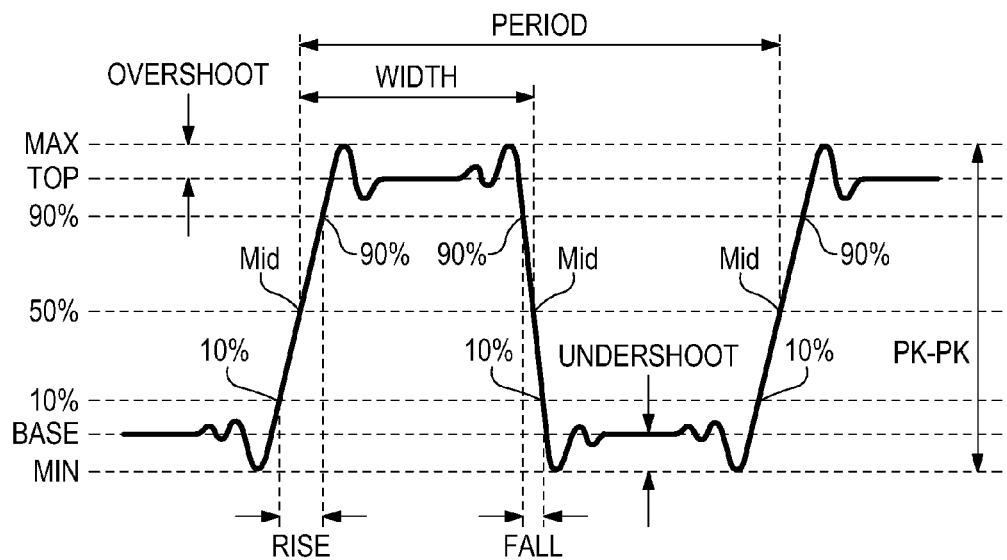
FIG. 2 is a diagram view of common features of a waveform.

Contexts are simply a set of foci and widths on a waveform. Contexts are defined either programmatically as part of the underlying waveform query engine or as part of the query language. For example, consider FIG. 2, which illustrates some common features of a waveform. In FIG. 2, a Period is defined as a context from one rising midpoint to the next rising midpoint. The small number of context definitions in FIG. 2 can easily be defined programmatically in the underlying query engine.

Several possible contexts are easily identified in FIG. 2. For example, a waveform segment between 10% and 90% or 90% and 10% is an Edge. Each Edge has a crossing that is the focus of interest. An Edge that is moving up as a Rising Edge and one that is moving down as a Falling Edge. A Period is a context from the crossing of one Rising Edge to the crossing on the next Rising Edge. This implies that besides having a Start and End focus, a context can have additional properties.

In fact, a context has several properties that can be used in a query. These properties are:

Occurrence—the occurrence is the index of this context within the ordered list of contexts found in this waveform.

Focus—the focus is the position in horizontal units that the context occurs on. This value may not be the same as the context's starting point. For example, a user may wish to define an Edge's focus at the crossing but have the Start and End positions be at the 10% and 90% foci. The Focus must always be greater than or equal to the Start and less than or equal to the End.

Width—the width in horizontal units. This property has a value equivalent to End minus Start. This property is returned by default if a context is used in an expression. For example, CH1.Rise<200 ns is equivalent to CH1.Rise.Width<200 ns.

Start—the context's beginning focus.

End—the ending focus of the context. The relationship End>Start must always be true.

Some contexts will want to define their own properties. For example, an Edge context will probably want to define a property for direction.

Contexts can also be defined in the query language itself It is possible to define a small number of built in contexts programmatically. From those built-in contexts, it is possible to build more complicated contexts using the query language. For example:

Define Context (Waveform x).Period
   when (x.Edge[occurrence].Direction == Rise)
     return x.Edge[occurrence].Focus to x.Edge[occurrence+2].Focus This example of a Period context definition works because a context is defined by moving through the waveform in ascending order on the horizontal axis. As referenced contexts (Edge in this example) are encountered, it is given an occurrence value. The first Edge has a value of 1, the second of 2 and so on. Each time the Period context definition is evaluated, the occurrence variable is set. By default, referring to x.Edge is equivalent to x.Edge[occurrence]. This example could be rewritten as:

Define Context (Waveform x).Period
   when (x.Edge.Direction == Rise)
     return x.Edge.Focus to x.Edge[occurrence+2].Focus This definition says that a period starts with a rising Edge and ends at the next rising Edge. Note that the "to" language construct defines the Start and End foci. If no additional focus is provided, then Start is used. By default, the Start point is included in the context but the End point is excluded for selection purposes. This means that a query such as, Mark CH1.Period when CH1.Rise>200 ns will only include the first Rise in the selection criterion. This can be overridden in the definition of a context by saying:

Define Context (Waveform x).Period
   when (x.Edge.Direction == Rise)
     return x.Edge.Focus to x.Edge[occurrence+2].Focus
     include End in Selection which means both Rise times would be included in the selection criterion.

Figure 3:
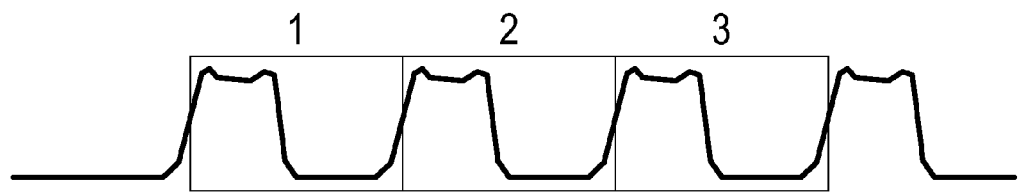
FIG. 3 is a diagram view depicting the occurrences of contexts that match the Period definition defined by a Define Context query constructed in accordance with the principles of the present invention.

A waveform may have zero or more contexts that match a specific context definition. For example, the Period context for the waveform depicted in FIG. 3 would have three occurrences of contexts that match the Period definition.

Specifying a context in a waveform query implicitly returns a list of all contexts (foci and widths) that match the context definition. For example, the following query would return all periods and mark them on the screen: mark Ch1.Period.

Figure 4:
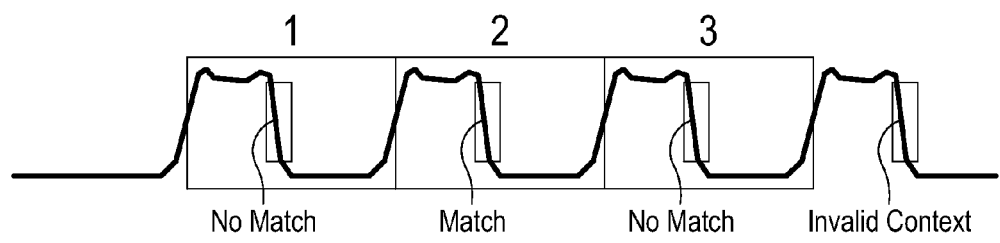
FIG. 4 is a diagram view depicting results of a Mark query constructed in accordance with the principles of the present invention.

A selection criterion refines that set into a smaller set that contains specific information that the user is interested in. For example, the query: mark CH1.Period when CH1.Fall>200 ns would consider only CH1 period contexts. It would then check the fall time within those contexts for values greater than 200 ns. In this example, the selection list will only have one period in it that is a Period, occurrence 2 (see FIG. 4).

Compound selection criteria, using the And Boolean expression, imply that all context selections must be met for a context to be selected. For example: mark CH1.Period when CH1.Rise<196 ns And CH1.Fall>212 ns would only return a set of Periods where both conditions are met.

A compound selection using the Or Boolean expression returns a set of contexts where either is true. For example, mark CH1.Period when CH1.Rise<196 ns Or CH1.Fall>212 ns.

A compound selection containing a Not Boolean operation performs a logical inversion. For example, mark CH1.Period when Not (CH1.Rise<196 ns Or CH1.Fall>212 ns) returns the set of all Periods that are do not meet the selection criterion.

Many selection criteria expressions are built using context definitions. For example the query, mark CH1.Period when CH1.Rise<196 ns Or CH1.Fall>212 ns uses the context definition of CH1.Rise and CH1.Fall. For the selection to be return true the following must be true:

1 Both CH1.Rise and CH1.Fall contexts must exist in the selection context (which is CH1.Period in this query). The only exception to this rule is if the Exists language construct is used. Exists implies the user would like to use the fact that a context exists or not in a Boolean expression.

2. The Boolean expression must evaluate to true.

Any of the standard set of Boolean operators applies. These operators include And, Or, and Not.

Comparison operators are available for using in numeric expressions. These operators include ==, !=, >, >=, <, <=.

As mentioned earlier, by default a context returns its Width if no specific property is referenced. This means the selection criterion, CH1.Rise<196 ns Or CH1.Fall>212 ns, is equivalent to, CH1.Rise.Width<196 ns Or CH1.Fall.Width>212 ns.

Not all selection criteria will include just contexts. It is also desirable to include measurements. For example, a user might want to find all periods whose Root Mean Square (RMS) is greater than 17.8. This could be defined in the following query: mark CH1.Period when CH1.RMS>17.8.

Figure 5:
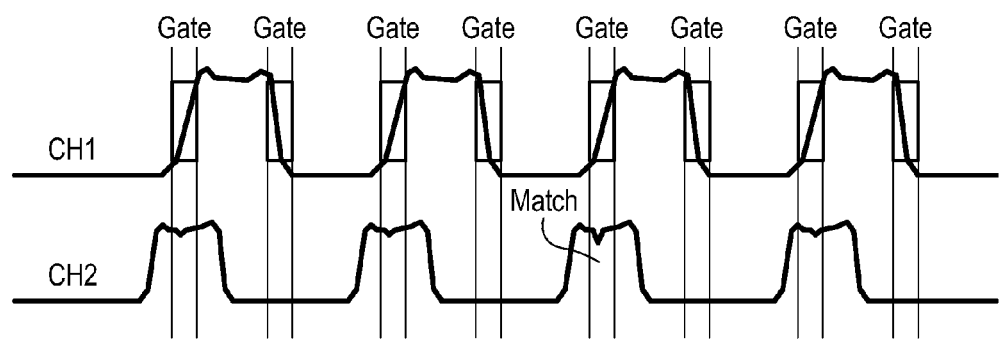
FIG. 5 is a diagram view depicting results of a Mark query constructed in accordance with the principles of the present invention.

Since RMS is a measurement rather than a query, there is an implied gate for the measurement. This gate is simply the Start and End positions for the context, which is CH1.Period in this case. This allows for some very expressive queries. For example, a user might want to perform the following query: mark CH1.Edge when (CH1, CH2).Crosstalk is >2.5 db. FIG. 5. shows how the measurements are gated and applied to the context defined in this query.

Math is referred to as types of computations where one or more waveforms are input and one more waveforms are output. For example, Math1=CH1+CH2. Any math operation built into the test and measurement instrument could be used in a query. For example, Mark CH1.Period when (CH1+CH2).Rise>200 ns. The actions performed on the result of a math operation are equivalent to the result if the same waveform was available as a channel.

In addition to a mark action, the query language defines a number of additional actions that can be performed on a set of selected contexts. These include:

Display—It is very useful to send a set of contexts to be displayed as a fast frame waveform, a Real-Time Eye waveform, or a Waveform Database:

Display CH1.Period when CH1.Rise > 200ns as Fastframe in Graticule1
or
Display Ch1.Period when CH1.Rise > 200ns as RTEye in Graticule1

Mark—Using this technique to create marks allows a large amount of context information to be included as well. Marks can be extended to include additional information such as context, selection criterion, and the display to associate the marks with:

Mark CH1.Period when CH1.PDuty<29%

Save—This operation allows sets to be saved to a file:

Save CH1.Period when CH1.Rise>200 ns in csv file @"c:\output.csv"

Store—Many test and measurement instruments have internal memory foci, such as Math1, Math2, Math3, Math4, and References, which are used to hold results:

Store CH1.Period when CH1.Rise > 200ns as Fastframe in Math1
or
Store CH1.Edge when CH1.Rise > 200ns as Track in Math1

Compute—It is useful to compute results based on the returned contexts:

Store Compute Count of CH1.Period when CH1.Rise>200 ns in Meas1

Stop On—Test and measurement instruments have hardware to cause trigger events, which can stop the acquisition of data. It is also useful to have a software mechanism to do this. This enables the test and measurement instrument to do a simple trigger using trigger hardware, but to use a query to decide when to stop and allow the user to look at an acquisition:

Stop On Not Empty CH1.TCPIP.Packet when
CH1.TCPIP.Destination.Port == 21 And CH1.RMS > 17.9

Highlight—A variation on Mark. Rather than associating a mark glyph with a results set, highlighting intensifies the region specified by each return context:

Highlight CH1.Period when CH1.PDuty<29%

Oscilloscopes are excellent for helping to seeing physical layer behavior in parallel or serial buses. In the past, oscilloscopes have not been good at relating with data at a protocol level. Currently available oscilloscopes now support decoding several slow speed serial buses. Using protocol decoding to add context and data information to the query language is very useful. For example: Mark CH1.TCPIP.Packet when CH1.TCPIP.Destination.Port==80 And (CH1,CH2).Crosstalk>2.5 db.

This query retrieves all contexts that are a TCP/IP packet and where the destination port is 80 and the crosstalk between CH1 and CH2 is greater than 2.5 db. This query implies that, just like in previous examples, decoded protocols can be defined as contexts. It also implies that a decoded protocol may also include Fields that can be used to extract the underlying value in the decoded protocol. The fields can be used in the selection criterion expression to help reduce the packets to ones that the user cares about. Notice in this example that both protocol specific fields and physical layer measurements can be mixed to return a meaningful result.

Configuring custom measurements is an essential feature of any analysis done on test and measurement signals. The query engine allows the configuration of key calculation elements using a generalized extension. For example consider the following query:

source1.WaveformDB(match source1.bits pattern 0b111 or
match source1.bits pattern 0b000)

Figure 6:
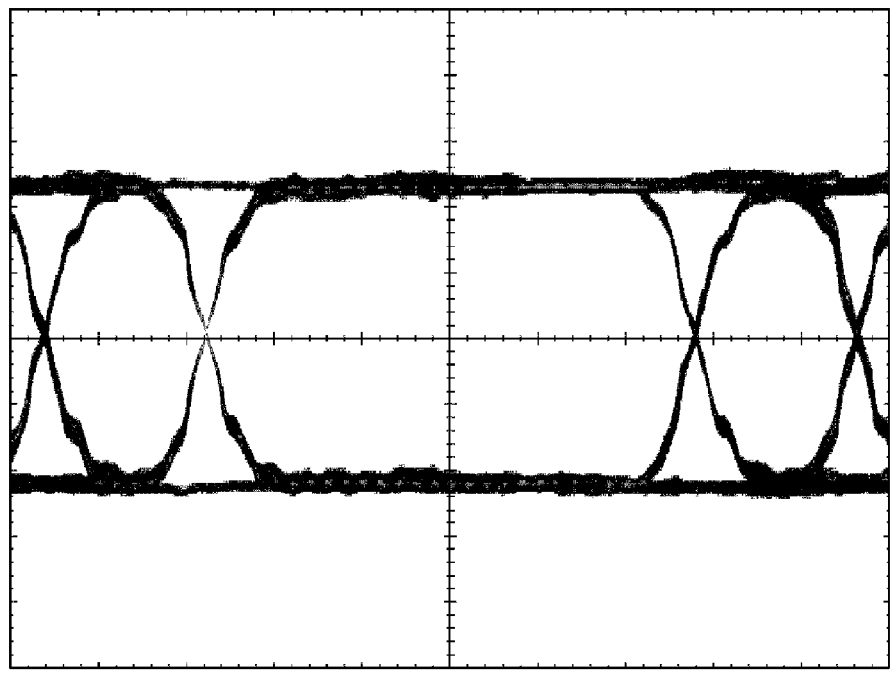
FIG. 6 is a diagram view depicting results of a query without special settings constructed in accordance with the principles of the present invention.

FIG. 6 shows the displayed waveform database of the resulting query.

Figure 7:
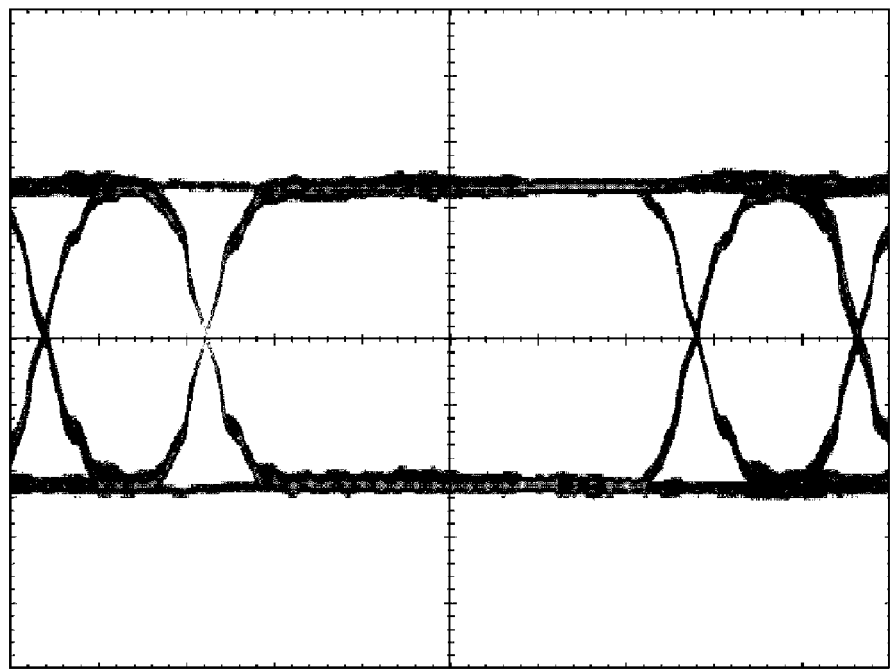
FIG. 7 is a diagram view depicting results of a query with Edge settings constructed in accordance with the principles of the present invention.

However, without changing the query, it is possible to change different aspects of the underlying calculations. For example the query:

[MREF=0.0, LREF=-100m, HREF=100m]
source1.WaveformDB(match source1.bits pattern 0b111 or
match source1.bits pattern 0b000)

tells the edge finder to use 0.0V as the middle reference point, −100 mV as the lower reference point, and 100 mV as the high reference point. The resulting image in FIG. 7 is very slightly different because these settings are not significantly different than the default settings.

Now consider this query:

```
[MREF=0.0,LREF=-150m,HREF=150m,ClockRecovery=Linear]
    source1.WaveformDB(match source1.bits pattern 0b111 or match
    source1.bits pattern 0b000)
```

The result shown in FIG. 8 shows the results of the previous query with Clock Recovery set to linear.

FIG. 9 notes the example of some of the items that may be modified using the settings syntax.

Operations Between Queries:

Intersection—Returns only the items found in both queries.
  Example: (source1.rise>2.6 n) intersect source1.period
Union—Combines items in two or more queries into a single query.
  Example: source1.rise union source1.fall
Context—Takes two Queries and places each item of the left hand query at the begin of the query and the following item in the right hand query at the end of the query.

```
Example: context source1.DDR3.Read.Header to context
    source1.DDR3.ReadWrite.End
```

Box Qualifier—Allows a query to be qualified with and inclusion or exclusion region. Please note that the operations "AND", "OR" and "NOT" apply to Box Qualifier expressions.

```
Example:
[MREF=0.0,LREF=-150m,HREF=150m,
    ClockRecovery=Linear,UI=Average(source1.bit.width)]
source1.WaveformDB(
              (match source1.bits pattern 0b0011 or
                  match source1.bits pattern 0b1100)
              When
              source1.Intersect
              (
                  begin-$UI*10%,
                  100m,
                  begin+$UI*10%,
                  -100m
              )
)
```

Mask Qualifier—Allows queries to be qualified by an oscilloscope mask file. This is similar to the Box Qualifier but mask files are used instead.

```
Example:
mask (match source1.bits pattern 0b0011 or
             match source1.bits pattern 0b1100)
    with mask1
```

In—Returns items in the left hand query within the context of of the right hand query.

```
Example:
    Source2.bits in source1.DDR3.Read.Burst
```

When—Returns item in the left hand query when the items in the right hand query are not empty.
  Example: source1.period when source1.Fall>2.6 n
Pattern Matching on Bits—
  a. Bit Sequences
    Example: match source1.bits pattern 0x110110
  b. Regular Expression
    Example: match source1.bits pattern (1+0001)|(0+1110)
Modifying Query Elements
  a. Begin—changes both the value and focus time to the beginning time.
  b. End—changes both the value and focus time to the ending time.
  c. Focus—changes the value to the focus time.
Math Calculation—This includes the basic operations on a query.
  a. Query+RealExpr—Adds the real results to each value in the query.
  b. RealExpr+Query—Adds the real results to each value in the query.
  c. Query+Query—Adds the corresponding values together. The left hand side is dominant meaning that the begin, end, and focus times are used.
  d. Query−RealExpr—Subtracts the real results from each value in the query.
  e. RealExpr−Query—Subtracts the query results value from the real value.
  f. Query−Query—Subtracts the left values from the corresponding right values. The left hand side is dominant meaning that the begin, end, and focus times are used.
  g. Query*RealExpr—Multiples the real results by each value in the query.
  h. RealExpr*Query—Multiples the query results value by the real value.
  i. Query*Query—Multiplies the left values with the corresponding right values. The left hand side is dominant meaning that the begin, end, and focus times are used.
  j. Query/RealExpr—Divides each value by the real.
  k. RealExpr/Query—Divides the real value by each result.
  l. Query/Query—Divides the values form the left query by the values in the right query. The left hand side is dominant meaning that the begin, end, and focus times are used.
  m. Query ^RealExpr—Takes the values from the left query to the power of the right real expression.
Custom Math Operations—It is useful to control all aspects of the creation of a new query. This handled with the for each <query> calculate <real assignments> command. For each generally deals with the current occurrence for value, width, begin, end, and focus. However, using the @ symbol means all occurrences. Therefore, in the following example, @ width means all occurrences of width.

```
Example:
    foreach source1.bit calculate
        Value=1/width,
        Begin=begin, End=end,
        Focus=begin+Mean(@width)/2
```

It is useful to be able to use the query language with decoded protocols. This is handled by specifying the supported protocol as part of the name of the operation to be handled. For example, here are 8b10b protocol support examples:

```
source1.8b10b.symbols
source1.8b10b.bytes-Returns the decoded 8 bit stream
source1.8b10b.words-Returns the decoded 10 bit words
```

An example using SATA would be:
Source1.SATA.symbols
These examples implicitly set up the symbol rates, and other settings required to perform the selected decoding.

Protocol decoded queries can use protocol regular expressions. For example: Match source1.8b10b.symbols pattern K28.5 D10.2 D10.2 D27.3

Waveform Databases are a way to visualize issues with large waveforms. Typically, these are thought of as Real-Time Eye diagrams. However, Real-Time Eye diagrams are simply a Waveform Database of bits. There are many other useful ways to visualize data rather than just using bits.

Figure 10:
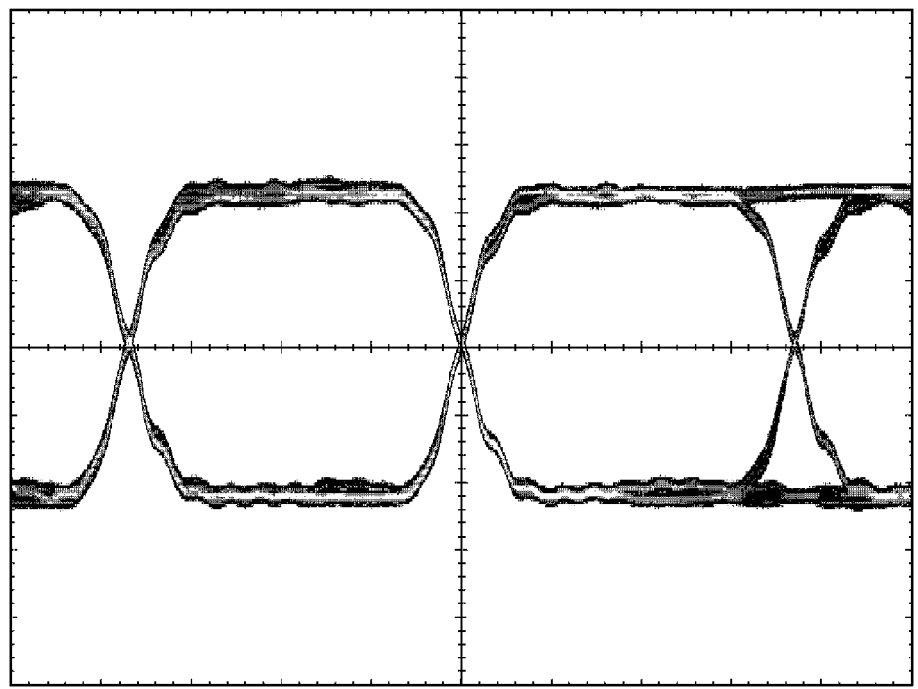
FIG. 10 is a diagram view depicting results of a query constructed in accordance with the principles of the present invention.

To make a waveform database all a user has to do is associate a waveform with a query. For example:

```
[MREF=0.0,LREF=-
150m,HREF=150m,ClockRecovery=Linear,UI=
Average(source1.bit.width)]
source1.WaveformDB(
        (match source1.bits pattern 0b0011 or
            match source1.bits pattern 0b1100)
        When
        source1.Intersect
        (
            begin-$UI*10%,
            100m,
            begin+$UI*10%,
            -100m
        )
)
``` results in the image depicted in FIG. 10.

There are several setting items that may need to be controlled when creating a Waveform Database. These items are:

Anchor points—Time focus of an interesting element of each query item. The default option is to use the center of the screen as the position for the focus point. In this example, WfmDbOffset allows the anchor point to be moved from the center by the specified amount.

Horizontal Scale—The width of item to be visualized. By default, this is determined by the average width of the items in the query.

Vertical Scale—the height of the item to be visualized. By default, this is determined by the amplitude of the waveform being visualized.

This is an example where the query used in FIG. 10 has been anchored at −UI*2:

```
[
    MREF=0.0,LREF=-150m,HREF=150m,
    ClockRecovery=Linear,
    UI=Average(source1.bit.width),
    WfmdbOffset=-$UI*2
]
source1.WaveformDB(
        (match source1.bits pattern 0b0011 or
            match source1.bits pattern 0b1100)
        When
        source1.Intersect
        (
            begin-$UI*10%,
            100m,
            begin+$UI*10%,
            -100m
        )
)
```

Figure 11:
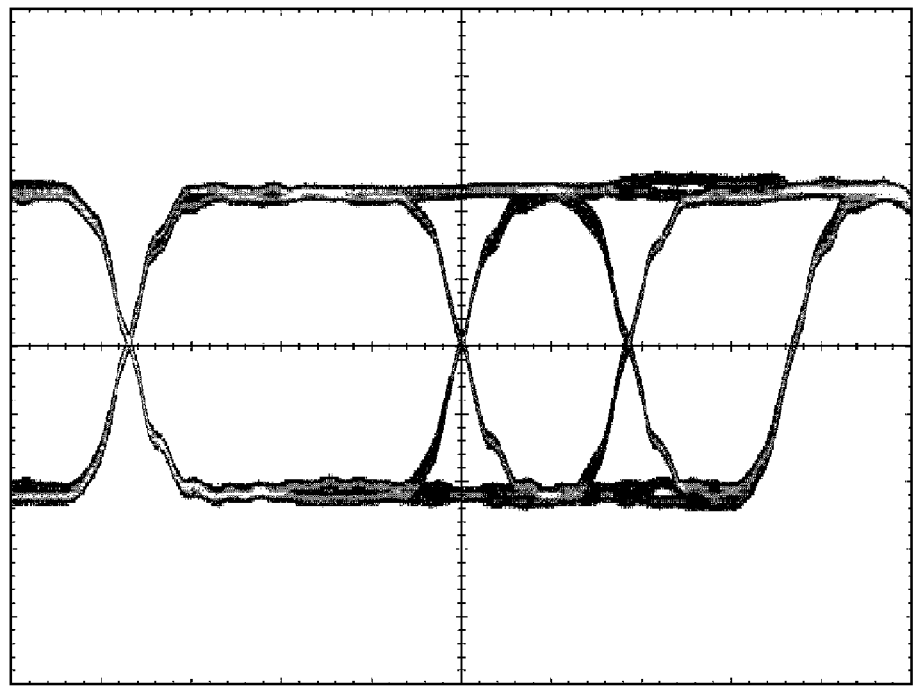
FIG. 11 is a diagram view depicting results of a query anchored at –UI*2 constructed in accordance with the principles of the present invention.

This query results in the image depicted in FIG. 11.

There are many useful operations that can be made on a waveform database. This includes mask testing, histogram operations, and visualization.

The following in an example DisplayPort preemphasis test made using waveform database results followed by multiple histogram operations:

```
// DisplayPort Pre-emphasis
[
    ClockRecovery=Linear,    // Options: <Edge>, Linear, PLL
    MREF=0.0,
    MINWFM=Minimum(source1),
    MAXWFM=Maximum(source1),
    P2P=$MAXWFM-$MINWFM,
    LREF=$MREF-$P2P*40%,
    HREF=$MREF+$P2P*40%,
    WfmMax=Maximum(source1),
    WfmMin=Minimum(source1),
    WfmMid=$MREF,
    WfmStartHigh=$WfmMid+$P2P*5%,
    WfmStartLow=$WfmMid-$P2P*5%,
    UI=Average(source1.bit.width),
    WfmdbFocus=<Begin>,       // Anchor at Begin of item
    WfmdbOffset=-400p,        // Anchor point
    //WfmdbHScale=200p,
    //WfmdbvScale=150m,
    Wfmdb= source1.WaveformDB(
        (match source1.bits pattern 0b0011 or
            match source1.bits pattern 0b1100)
        When
        sourc1.Intersect
```

```
    (
        begin-$UI*10%,
        100m,
        begin+$UI*10%,
        -100m
    )
),
Vtop_pe=#Wfmdb.Vertical.Histogram($WfmdbOffset+$UI*45%, $WfmMax,
$WfmdbOffset+$UI*55%, $WfmStartHigh).Mean,
    Vbase_pe=#Wfmdb.Vertical.Histogram($WfmdbOffset+$UI*45%, $WfmStartLow,
$WfmdbOffset+$UI*55%, $WfmMin).Mean,
    Vswing_pe=$Vtop_pe-$Vbase_pe,
    Vtop=#Wfmdb.Vertical.Histogram($WfmdbOffset+$UI*2.0+$UI*45%, $WfmMax,
$WfmdbOffset+$UI*2+$UI*55%, $WfmStartHigh).Mean,
    Vbase=#Wfmdb.Vertical.Histogram($WfmdbOffset+$UI*2+$UI*45%, $WfmStartLow,
$WfmdbOffset+$UI*2+$UI*55%, $WfmMin).Mean,
    Vswing=$Vtop-$Vbase,
    Output=$Vswing_pe/$Vswing,
    Label="Preemphasis"
]
$Vswing
```

Qualifier windows are useful for filtering using analog information. For example, it is often necessary in protocol analysis to filter bit patterns such that the first bit in the bit pattern is a transition bit. This is easy to do with a qualifier window. Here's an example:

```
[
    ClockRecovery=Linear,
    UI=Average(source1.bit.width)
]
(match source1.bits pattern 0b0011 or
    match source1.bits pattern 0b1100)
When
source1.Intersect
(
    begin-$UI*10%,
    100m,
    begin+$UI*10%,
    -100m
)
```

Masks are used in test and measurement instruments to look for violations of a specification. Masks enable users to evaluate the analog quality of their digital signals. Unlike Qualifier windows, masks are not just rectangles, but define polygons as inclusive or exclusive regions. Masks can be applied to waveform databases to return pass/fail or hit counts.

Figure 12:
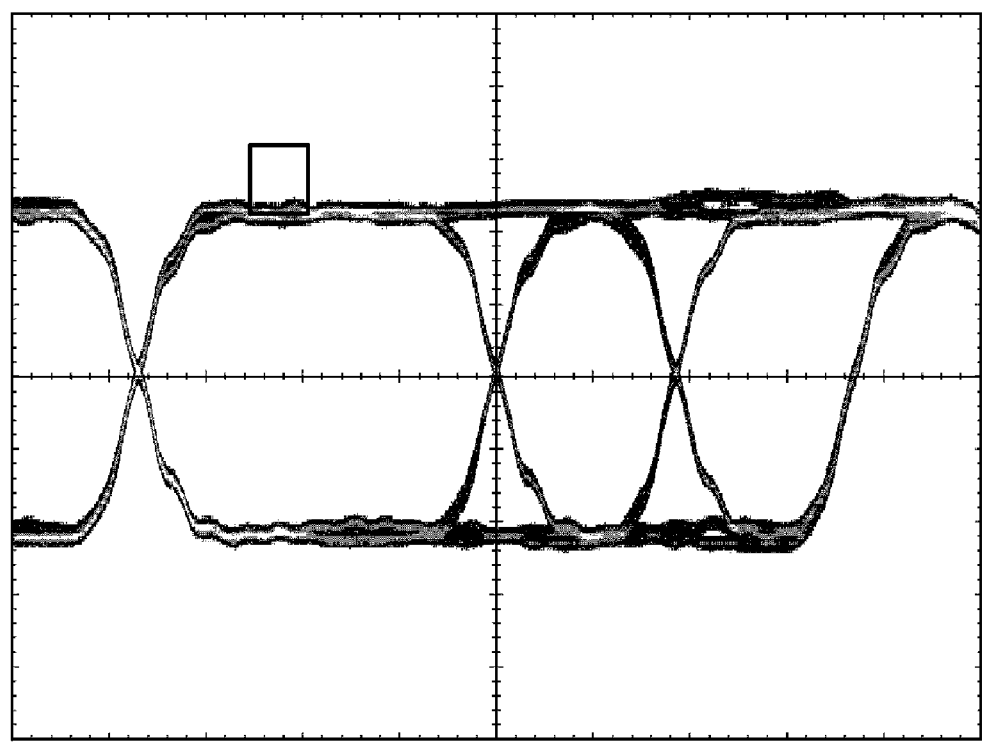
FIG. 12 is a diagram view depicting results of a query creating a user-defined box constructed in accordance with the principles of the present invention.

If an instrument User Interface displays a Waveform Database that is the result of a query, and the user selects a region of that waveform database to explore (see FIG. 12), it is possible to construct a query automatically that will find all of the elements that intersect with the user box.

To create an expression that will find all of these occurrences in the waveform, a user does the following:
Take the Original Query:

```
[
    ClockRecovery=Linear,
    UI=Average(source1.bit.width)
]
(match source1.bits pattern 0b0011 or
    match source1.bits pattern 0b1100)
When
source1.Intersect
```

-continued

```
(
    begin-$UI*10%,
    100m,
    begin+$UI*10%,
    -100m
)
```

Note that the box is at:
Top=325 mV, Bottom=212 mV, Left=-460 pS, Right=-290 pS
Now construct a new query as follows:

```
<previous query> when source1.Intersects(-460p+$WfmDBOffset, 325m,
-290p+$WfmDBOffset, 212m)
```

The results from this query will only contain the foci that intersect with the user drawn box.

Figure 13:
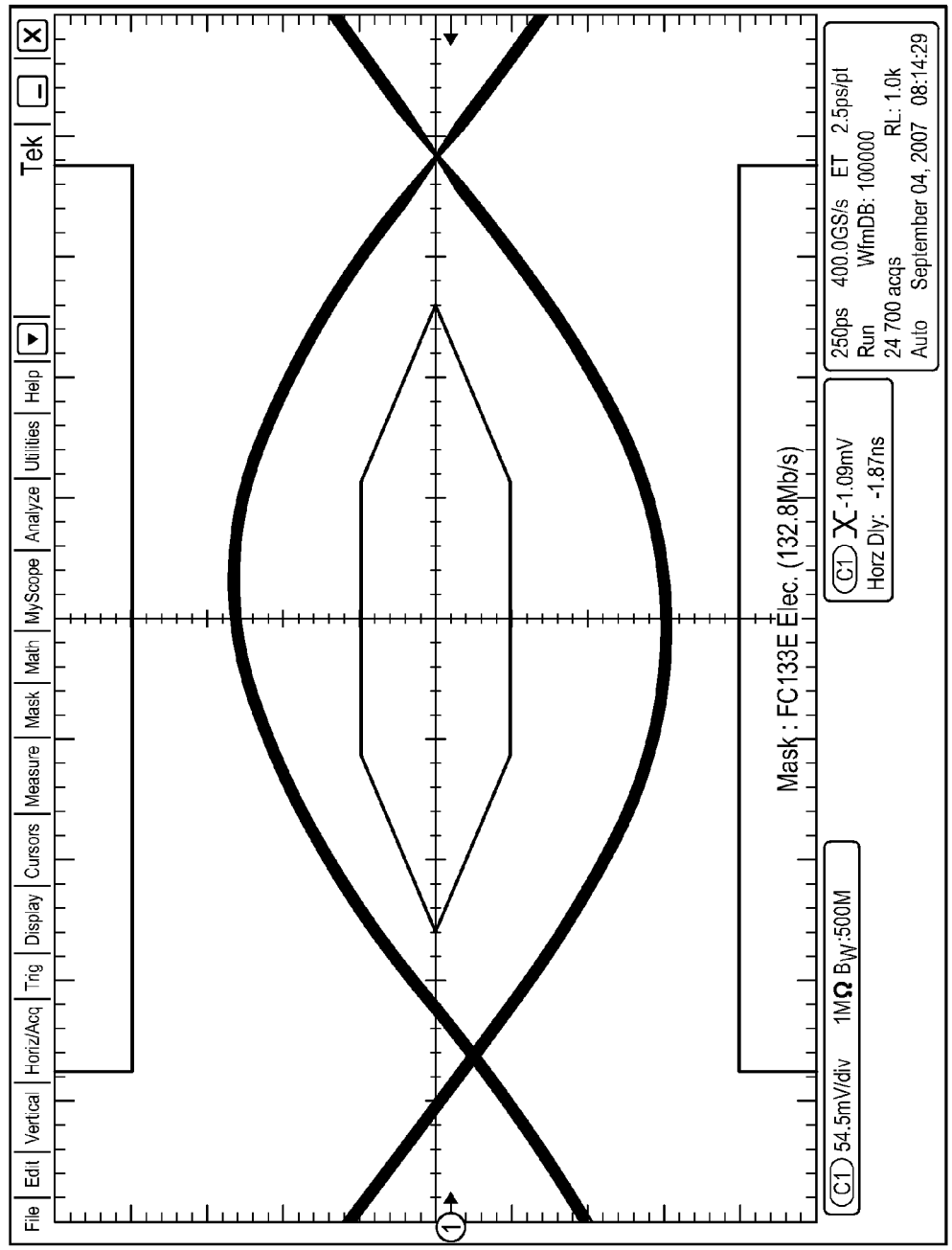
FIG. 13 is a diagram view depicting an eye diagram mask test constructed in accordance with the principles of the present invention.
Figure 14:
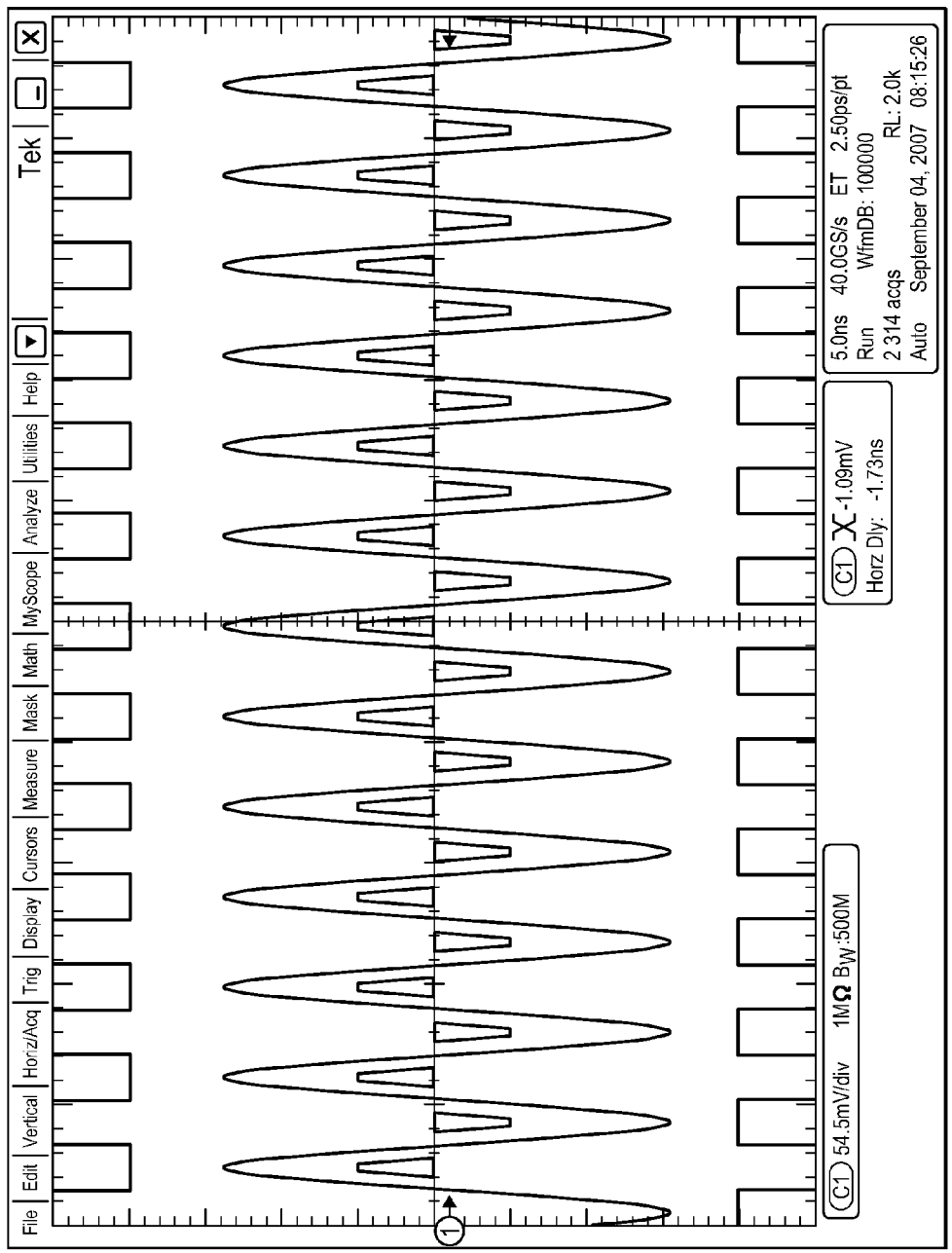
FIG. 14 is a diagram view depicting a Y-T waveform with unwrapped mask constructed in accordance with the principles of the present invention.

Simultaneous and synchronized evaluation of multiple data presentations is becoming more important so that users can see the same data from different perspectives in order to troubleshoot more quickly and effectively. Consequently, an alternative implementation of masks has also been developed as part of the current invention. This consists of the simultaneous and synchronized presentation of both an eye diagram mask test (FIG. 13) and its constituent (non-overlaid) Y-T waveform with corresponding "unwrapped" mask (FIG. 14). A Y-T waveform, where Y is amplitude and T is time, enables a user to analyze the time relationship between multiple input signals. The invention's alternative implementation of masks makes it possible for a user to view a problem area on the eye diagram mask test (e.g. eye closure, which indicates interference, amplitude irregularities, or timing problems, such as jitters, depending on the signal that is measured) and immediately correlate it to a point in the same data set as a traditional Y-T waveform. The user can do this today using a conventional test and measurement instrument, but the mask cannot be seen simultaneously in both views of the data.

Figure 15:
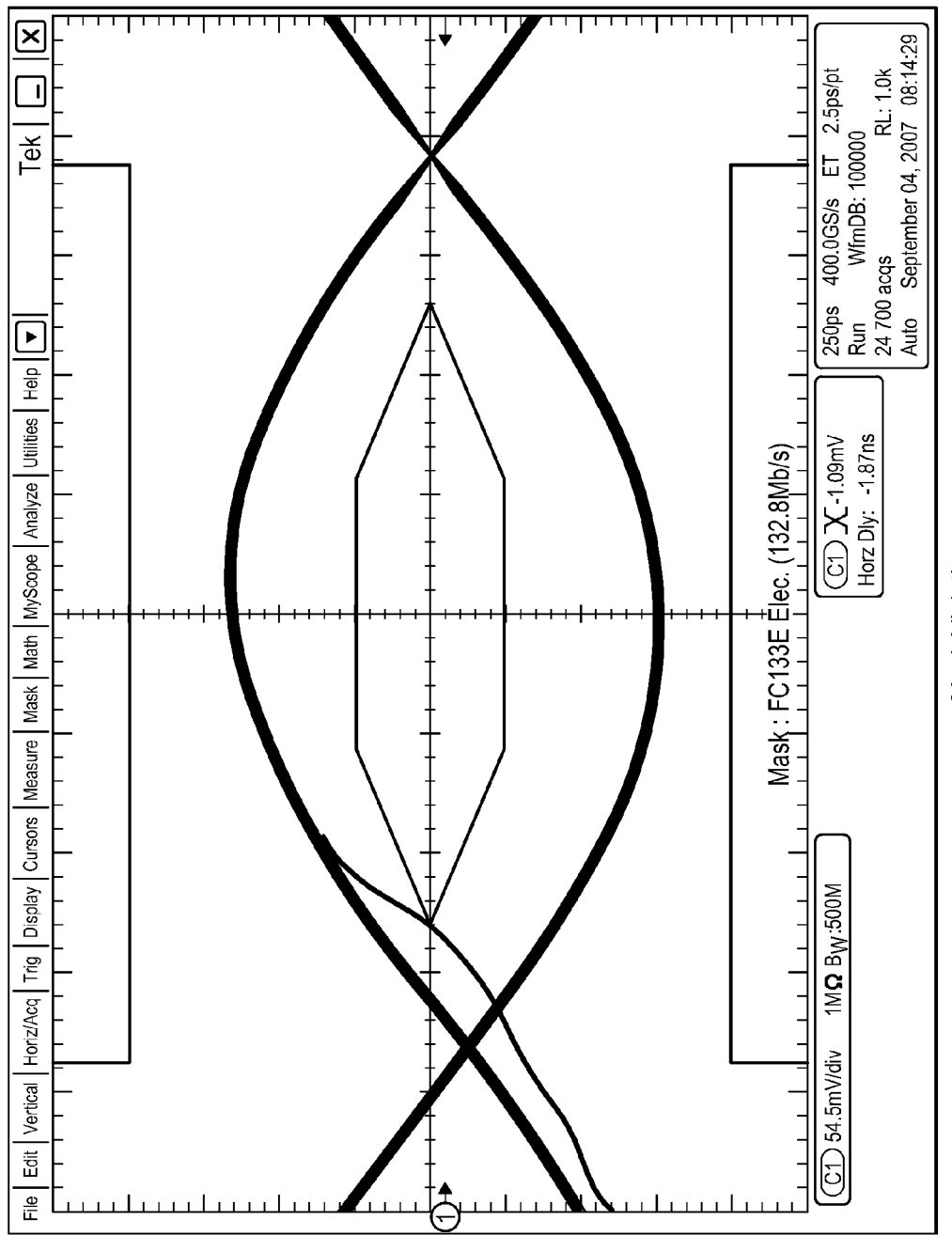
FIG. 15 is a diagram view depicting an eye diagram mask test with a mask violation.
Figure 16:
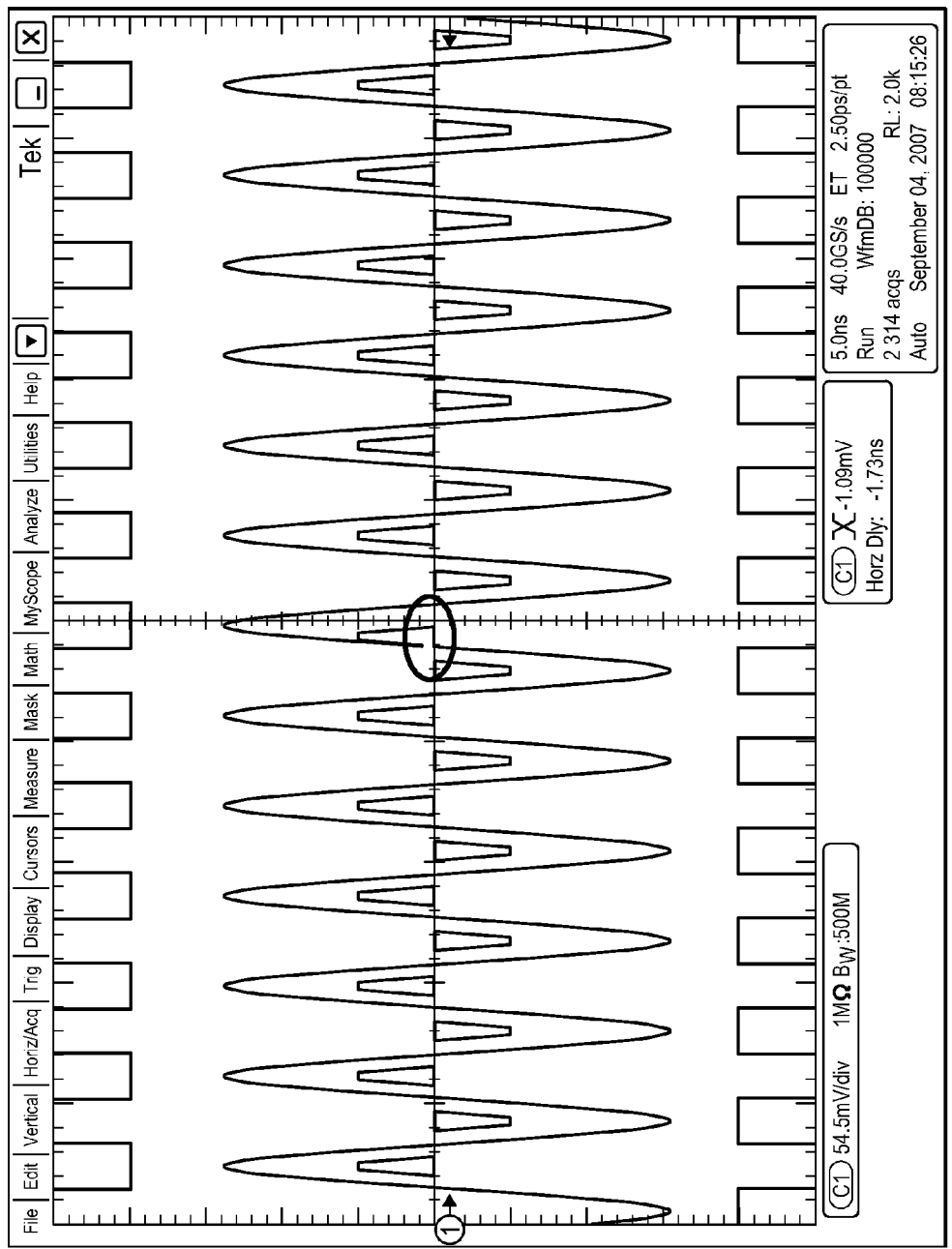
FIG. 16 is a diagram view depicting a Y-T waveform with an unwrapped mask having a mask violation.
Figure 17:
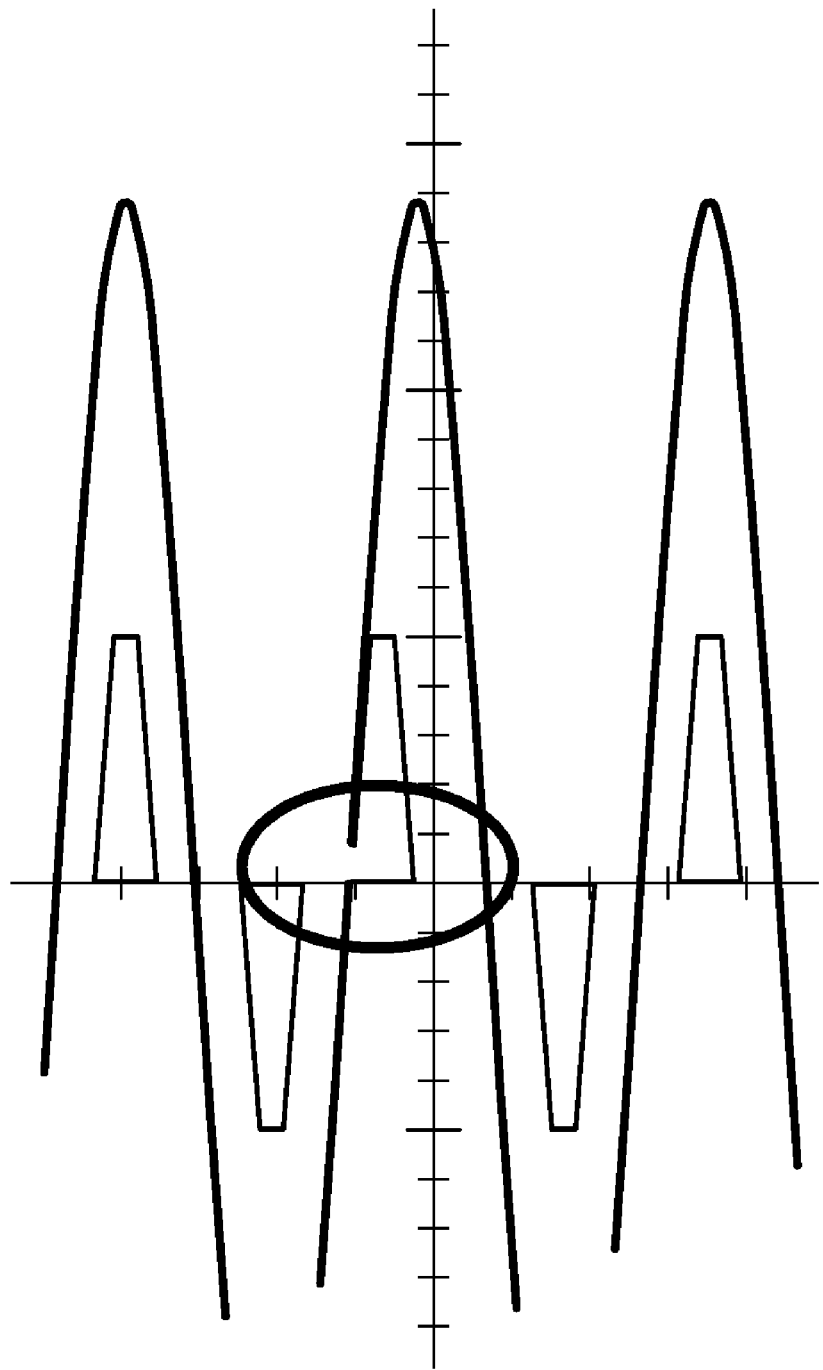
FIG. 17 is a diagram view depicting the mask violation of FIG. 16 in detail.

For example, the mask might show a violation in the eye diagram (FIG. 15). The user can choose to view the violating section of the record in Y-T format (FIG. 16). This will allow the user to see the shape of the waveform in Y-T format (including the same mask that the user was looking at with the eye diagram in FIG. 15). This makes it possible for the user to locate the mask violation easily (shown in detail in FIG. 17).

To create a waveform database (WaveformDB) for the display to overlay the mask, a user does the following:

```
[
    ClockRecovery=PLL,
    UI=Average(source1.bit.width),
    WfmDBFocus="Begin",   //   Anchors the beginning of a time window to the center
of the WaveformDB
    WfmDBOffset=-$UI/2.0   //   Moves the center of the WfmDB to the left ½ UI -
this centers the bit in the wfmdb.
    // WfmDBVScale = 200m - This is an optional scale setting, this is usually
automatically calculated.
    // WfmDBHScale = 100p - This is an optional scale setting and is usually
automatically calculated based on the average window duration.
]
source1.WaveformDB(source1.Bits)
source1.Bits - Specifies the creation of a collection of time windows for each bit and
its current value. The time window uses a PLL clockrecovery technique to precisely
align the timing for each bit.
source1.WaveformDB(source1.Bits) - Creates a 2D histogram by accumulating hit
counts from source1 when sub sections defined by the time windows in source1.bits are
overlaid on the histogram. The timing relationship between source1.bits and the
WaveformDB is defined using WFMDBFocus and WfmDBOffset parameters.
```

The display renders the WaveformDB and then overlays the Mask using the WfmDBVScale/WfmDBHScale values embedded in the WaveformDB.

To count mask hits, a user does the following:

```
[
    ClockRecovery=PLL,
    UI=Average(source1.bit.width),
    WfmDBFocus="Begin", // Anchors the beginning of a time window
to the center of the WaveformDB
    WfmDBOffset=-$UI/2.0 // Moves the center of the WfmDB to the
left ½ UI - this centers the bit in the wfmdb
    // WfmDBVScale = 200m - this is an optional scale setting, this is
usually automatically calculated.
    // WfmDBHScale = 100p - this is an optional scale setting and is
usually automatically calculated based on the average window duration.
]
mask1.Hits(source1.WaveformDB(source1.Bits))
```

Mask1.Hits( . . . )—this takes in a histogram created by the preceding query, overlays the polygons of the mask, and sums the number of hits in the histogram for elements contained in the polygon regions of the mask. The mask orients itself on the WaveformDB based on the WfmDBVScale and WfmDBHScale values embedded in the WaveformDB.

To determine foci where mask hits have occurred, a user does the following:

```
[
    ClockRecovery=PLL,
    UI=Average(source1.bit.width),
    WfmDBFocus="Begin", // Anchors the beginning of a time window
to the center of the WaveformDB
    WfmDBOffset=-$UI/2.0 // Moves the center of the WfmDB to the
left ½ UI - this centers the bit in the wfmdb
    // WfmDBVScale = 200m - this is an optional scale setting, this can
usually be automatically calculated.
    // WfmDBHScale = 100p - this is an optional scale setting and is
usually calculated based on the average window duration.
]
source1.bits when mask1.Hits(source1.WaveformDB(current)) > 0
```

The when operation executes the conditional on the right side of the operation for each item on the left side. If the conditional returns true the left side item is retained otherwise it is discarded. In this example, the query builds a WaveformDB for each individual time window (defined by the keyword current). If there is a mask hit in that time window, then that value is retained. This simple example unwraps the mask and returns only the time windows with hits in the mask. Subsequently, the query language can be used to place marks that can be navigated through to observe the mask hits.

Unwrapping the mask on the display is accomplished by overlaying the mask with the equivalent information to WfmDBFocus/WfmDBOffset at the foci defined using the result from a query such as the one below that was used to create the original overlaid mask. To show mask hits, it would also need a WaveformDB for each time window range. This can be calculated in a manner similar to that used to create the original overlaid mask, but for the individual time window.

```
[
    ClockRecovery=PLL,
    UI=Average(source1.bit.width)
]
source1.Bits
```

Figure 18:
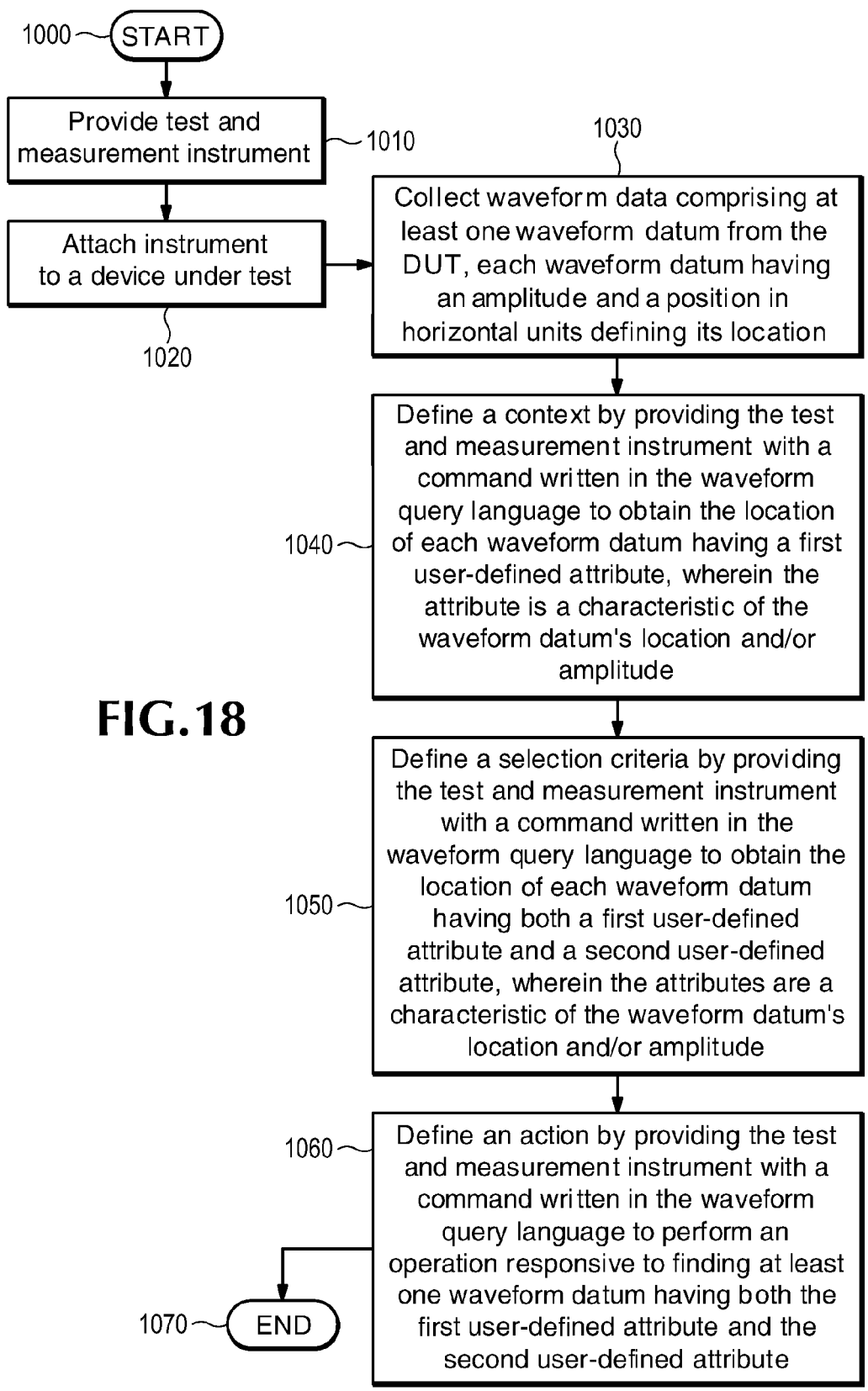
FIG. 18 is a flowchart view of a method of processing waveform data from one or more channels using a test and measurement instrument of the present invention.

The invention also includes a method of processing waveform data from one or more channels using a test and measurement instrument 1000, which is depicted in FIG. 18. The method of processing waveform data from one or more channels using a test and measurement instrument consists of the following steps: providing the test and measurement instrument (1010); attaching the test and measurement instrument to a device under test (1020); collecting waveform data comprising at least one waveform datum from the DUT, each waveform datum having an amplitude and a position in horizontal units defining its focus (1030); defining a context by providing the test and measurement instrument with a command written in the waveform query language to obtain the focus of each waveform datum having a first user-defined attribute, wherein the attribute is a characteristic of the waveform datum's focus and/or amplitude (1040); defining a selection criteria by providing the test and measurement instrument with a command written in the waveform query language to obtain the focus of each waveform datum having both a first user-defined attribute and a second user-defined attribute, wherein the attributes are a characteristic of the waveform datum's focus and/or amplitude (1050); and defining an action by providing the test and measurement instrument with a command written in the waveform query language to perform an operation responsive to finding at least one waveform datum having both the first user-defined attribute and the second user-defined attribute (1060).

While current embodiments of the method of processing waveform data from one or more channels using a test and measurement instrument have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitable test and measurement instrument may be used instead of the oscilloscope described.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A method of processing waveform data from one or more channels using a test and measurement instrument comprising the steps of:
    providing a test and measurement instrument;
    attaching the test and measurement instrument to a Device Under Test (DUT) to be measured;
    collecting waveform data including at least one waveform datum from the DUT, each waveform datum having an amplitude and a position in horizontal units defining its focus;
    defining a context by instructing the test and measurement instrument to obtain the focus of each waveform datum having a first user-defined attribute, wherein the attribute is a characteristic of the waveform datum's focus and/or amplitude;
    defining a selection criteria by instructing the test and measurement instrument to obtain the focus of each waveform datum having both the first user-defined attribute and a second user-defined attribute, wherein the attributes are a characteristic of the waveform datum's focus and/or amplitude; and
    defining an action by instructing the test and measurement instrument to perform an operation responsive to finding at least one waveform datum having both the first user-defined attribute and the second user-defined attribute.

2. The method of processing waveform data as defined in claim 1, wherein the test and measurement instrument is an oscilloscope.

3. The method of processing waveform data as defined in claim 1, wherein the context has the properties of occurrence, start, end, and width, wherein occurrence is the index of the context within an ordered list of contexts in the waveform data, start is the beginning focus of the context, end is the ending focus of the context, and width has a value equal to end minus start.

4. The method of processing waveform data as defined in claim 1, wherein the selection criteria comprise a single attribute.

5. The method of processing waveform data as defined in claim 1, wherein the selection criteria comprise multiple attributes.

6. The method of processing waveform data as defined in claim 1, wherein the selection criteria comprise a measurement.

7. The method of processing waveform data as defined in claim 1, wherein the selection criteria comprise the result of a mathematical formula.

8. The method of processing waveform data as defined in claim 1, wherein the operation is selected from the group comprising displaying the waveform data having both the first user-defined attribute and the second user-defined attribute on the test and measurement instrument's graticule as a FastFrame waveform, a real-time eye diagram, a Y-T waveform with a corresponding unwrapped mask, or a waveform database; marking the waveform data having both the first user-defined attribute and the second user-defined attribute on the test and measurement instrument's graticule; saving the waveform data having both the first user-defined attribute and the second user-defined attribute to a file; storing the waveform data having both the first user-defined attribute and the second user-defined attribute within a memory focus in the test and measurement instrument; computing a result from the waveform data having both the first user-defined attribute and the second user-defined attribute; stopping data acquisition by the test and measurement instrument responsive to identifying the waveform data having both the first user-defined attribute and the second user-defined attribute; and highlighting the waveform data having both the first user-defined attribute and the second user-defined attribute on the test and measurement instrument's graticule.

9. A method of processing waveform data from one or more channels by using a test and measurement instrument to process commands written in a waveform query language comprising the steps of:
    providing a test and measurement instrument, wherein the test and measurement instrument has programmatic instructions for processing commands written in a waveform query language;
    attaching the test and measurement instrument to a Device Under Test (DUT) to be measured;
    collecting waveform data including at least one waveform datum from the DUT, each waveform datum having an amplitude and a position in horizontal units defining its focus;
    defining a context by providing the test and measurement instrument with a command written in the waveform query language to obtain the focus of each waveform datum having a first user-defined attribute, wherein the attribute is a characteristic of the waveform datum's focus and/or amplitude;
    defining a selection criteria by providing the test and measurement instrument with a command written in the waveform query language to obtain the focus of each waveform datum having both the first user-defined attribute and a second user-defined attribute, wherein the attributes are a characteristic of the waveform datum's focus and/or amplitude; and
    defining an action by providing the test and measurement instrument with a command written in the waveform query language to perform an operation responsive to finding at least one waveform datum having both the first user-defined attribute and the second user-defined attribute.

10. The method of processing waveform data as defined in claim 9, wherein the test and measurement instrument is an oscilloscope.

11. The method of processing waveform data as defined in claim 9, wherein the context has the properties of occurrence, start, end, and width, wherein occurrence is the index of the context within an ordered list of contexts in the waveform data, start is the beginning focus of the context, end is the ending focus of the context, and width has a value equal to end minus start.

12. The method of processing waveform data as defined in claim 9, wherein the selection criteria comprise a single attribute.

13. The method of processing waveform data as defined in claim 9, wherein the selection criteria comprise multiple attributes.

14. The method of processing waveform data as defined in claim 9, wherein the selection criteria comprise a measurement.

15. The method of processing waveform data as defined in claim 9, wherein the selection criteria comprise the result of a mathematical formula.

16. The method of processing waveform data as defined in claim 9, wherein the operation is selected from the group comprising displaying the waveform data having both the first user-defined attribute and the second user-defined attribute on the test and measurement instrument's graticule as a FastFrame waveform, a real-time eye diagram, a Y-T waveform with a corresponding unwrapped mask, or a waveform database; marking the waveform data having both the first user-defined attribute and the second user-defined attribute on the test and measurement instrument's graticule; saving the waveform data having both the first user-defined attribute and the second user-defined attribute to a file; storing the waveform data having both the first user-defined attribute and the second user-defined attribute within a memory focus in the test and measurement instrument; computing a result from the waveform data having both the first user-defined attribute and the second user-defined attribute; stopping data acquisition by the test and measurement instrument responsive to identifying the waveform data having both the first user-defined attribute and the second user-defined attribute; and highlighting the waveform data having both the first user-defined attribute and the second user-defined attribute on the test and measurement instrument's graticule.

* * * * *